United States Patent

Rothschild et al.

[15] 3,653,997

[45] Apr. 4, 1972

[54] CONDITIONING AND SHAPING SOLUTION FOR CIRCUIT BOARDS

[72] Inventors: Bill F. Rothschild, Whittier; Fredrick C. Seymour, Downey; Jon G. Thomas, Anaheim, all of Calif.

[73] Assignee: North American Rockwell Corporation

[22] Filed: June 22, 1970

[21] Appl. No.: 48,247

[52] U.S. Cl. .......... 156/3, 117/49, 156/7, 156/18, 252/79.2

[51] Int. Cl. .......... C23f 1/02, C09k 3/00

[58] Field of Search .......... 156/3, 2, 7, 18; 117/47, 49, 117/50, 51; 204/15, 20, 24, 30, 32, 141, 143

[56] References Cited

UNITED STATES PATENTS

| | | | |
|---|---|---|---|
| 3,351,555 | 11/1967 | Byers et al. | 156/18 X |
| 3,442,810 | 5/1969 | Elbreder | 252/79.4 |
| 3,471,320 | 10/1969 | Saubestre et al. | 117/47 |
| 3,476,624 | 11/1969 | Hogya et al. | 252/79.1 |

*Primary Examiner*—William A. Powell

*Attorney*—L. Lee Humphries, H. Fredrick Hamann and Robert G. Rogers

[57] ABSTRACT

A preferred solution of sodium dichromate, sulfuric acid, and orthophosphoric acid maintained at a pH of less than one is used to etch away sharp edges (burrs) remaining after a copper clad epoxy-glass laminate has been drilled and to condition the epoxy glass for metal deposition.

8 Claims, 2 Drawing Figures

INVENTORS
BILL F. ROTHSCHILD
FREDRICK C. SEYMOUR
JON G. THOMAS
BY Robert G. Rogers
ATTORNEY

CONDITIONING AND SHAPING SOLUTION FOR CIRCUIT BOARDS

BACKGROUND OF THE INVENTION

1. Field of the Invention

The invention relates to a conditioning and shaping solution for circuit boards and, more particularly, to such a solution containing chromium +6, sulfate, and orthophosphate ions.

2. Description of Prior Art

Burrs (sharp protruding edges) are formed on a metal foil during a through-hole drilling operation. Copper foil on an epoxy-glass dielectric substrate is an example of a metal foil layer. The layers may be on the outer substrate surfaces or copper foil layers may be sandwiched between several dielectric layers. If the burrs are not removed, the circuit board, such as a printed wiring board or multilayer board, would have a rough surface and the rough edges could prevent a satisfactory plating of the holes between the layers of the board.

In the usual process sequence, the foil layer is sanded following the drilling of the through holes. The sanding operation removes some burrs but other burrs are turned down into the hole. In order to remove all burrs, a deburring or honing process is required.

FIG. 1 (prior art) illustrates a copper foil layer 1 between two epoxy-glass layers 2 and 3. FIG. 1 is a partially plated through hole 11. As shown by the figure, when the copper layer is not shaped by a deburring solution, high current density areas result. The areas are identified by the numerals 4 and 5. High current density areas often result in disconnected plated zones called ghost planes. In order to overcome the "ghost plane" problem, the plating process time must be extended. An extension of time may result in an overthick plated surface layer.

The dotted lines in FIG. 1 illustrate a metal layer 8 deposited on one surface of a through hole which was not previously conditioned and subjected to a deburring solution. The ghost planes in the incomplete areas are identified by numerals 6 and 7.

Another reason for using a deburring solution is to condition the epoxy-glass dielectric surface for improving the quality of the adhesion of the electroless deposition and the subsequent electro-deposit. Copper is an example of an electroless and electrolytic deposit. In some deburring solutions, and in cases where no deburring solution is used, the plated layer 9 breaks loose, or becomes separated, from the epoxy-glass layer as is shown in FIG. 1 by the numeral 10. The plated metal layer 9 either does not adhere to the epoxy-glass surface or if it does adhere initially, it becomes separated later. As a result, a poor quality plated through hole is produced.

However, although deburring and conditioning solutions are required, the type of solution is important. In some solutions, the copper is etched at such a rapid rate that exposed portions of the copper foil layer in the through hole are completely removed without leaving any foil area to which a plated through hole metal layer can adhere. In addition, some solutions are so active that the etching continues after the board has been removed from the solution. Still other solutions produce noxious gasses. Other solutions etch at such a slow rate as to be impractical.

Examples of existing deburring and conditioning solutions include a nitric and acetic acid solution operated at room temperatures, and an ammonium persulphate-sulfuric acid solution. The solutions are further compared with the present solution in the description of the preferred embodiment.

SUMMARY OF THE INVENTION

Briefly, the invention is an aqueous conditioning and etching solution comprising a chromium +6 ion, a soluble sulphate ion and an orthophosphate ion maintained at a pH of less than 1.

In the preferred form, the solution can use any soluble chromium oxide combination, such as sodium dichromate, that yields the equivalent molar amount of chromium +6 ion and other compounds yielding a soluble sulphate ion and an orthophosphate ion. The phosphate, sulphate and +6 chromium ion can be supplied by alkali metal compounds, copper compounds, etc.

Therefore, it is an object of this invention to provide an improved deburring and conditioning solution.

It is another object of this invention to provide an improved etching and conditioning solution for copper clad dielectric laminates.

It is another object of this invention to provide an improved solution for shaping edges of copper foil layers and for conditioning epoxy-glass layers for improving the quality of the copper layers deposited on the conditioned epoxy-glass surface and on the shaped copper foil layers.

Still another object of this invention is to provide an improved deburring solution for eliminating conditions that cause ghost planes so that an improved quality plated through hole results.

A further object of this invention is to provide a solution for deburring sharp protruding edges of a copper foil layer and for conditioning an epoxy-glass surface without producing noxious gases.

A further object of this invention is to provide an improved solution for deburring and conditioning a printed wiring board without having the etching continue after the printed wiring board has been removed from the solution.

A further object of this invention is to provide an improved conditioning and etching solution for copper foil in combination with the epoxy-glass laminate that can be used in an automatic or manual printed wiring board production process.

These and other objects of the invention will become more apparent when taken in connection with the description of the drawings, a brief description of which follows.

DESCRIPTION OF THE PREFERRED EMBODIMENTS

Figure 1:
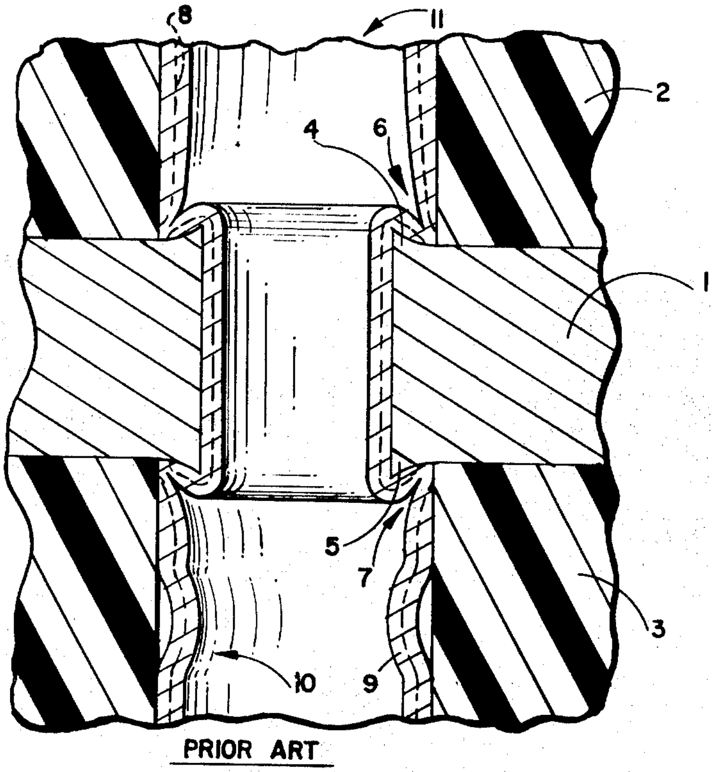
FIG. 1 (prior art) is a cross-sectional view of one-half of a plated through hole showing a metal foil layer sandwiched between two dielectric layers.

The solution comprises any soluble chromium oxide combination that yields the equivalent molar amount of chromium +6 ion, with any source of soluble sulphate ion and orthophosphate ion can be supplied by alkali metal compounds, copper compounds, etc. An acid comprised of the orthophosphate or sulphate ion is added to maintain the pH of the solution at less than 1. The pH of the solution determines the rate at which the copper is etched. The etching is achieved by the chromium and sulphate ions.

The following Table I is an example of one embodiment of the solution showing a preferred composition and a range for the solution constituents:

TABLE I

| Solution | Preferred Value | Range |
|---|---|---|
| $Na_2Cr_2O_7 \cdot 2H_2O$ (Sodium Dichromate) | 64 grams per liter | 20–160 grams per liter |
| $H_2SO_4$ (Sulfuric Acid) | 313 grams per liter | 200–400 grams per liter |
| $H_3PO_4$ (Orthophosphoric Acid) | 34 grams per liter | 17–100 grams per liter |

Lithium, potassium and ammonium compounds can be substituted for sodium (Na) in the above formula.

The following Table II illustrates examples of the ions in the solution which are necessary to produce the preferred range given in Table I:

TABLE II

| Solution | Preferred Range |
|---|---|
| A | |
| $Cr_2O_7^{-2}$ | 46.5 grams per liter |
| $SO_4$ | 306.0 grams per liter |
| $PO_4^{-2}$ | 33 grams per liter |
| pH less than 1 | |
| B | |
| $CrO_4^{-2}$ | 50 grams per liter |
| $SO_4^{-2}$ | 306 grams per liter |
| $PO_4^{-2}$ | 33 grams per liter |
| pH less than 1 | |
| C | |
| $CRO_3$ | 43 grams per liter |
| $SO_4$ | 306 grams per liter |
| $PO_4^{-2}$ | 33 grams per liter |
| pH less than 1 | |

The superscript, $^{-2}$, indicates the charge of the ion. The cation can be alkali metals, hydrogen, copper, ammonium, and a combination of the compounds. Examples of compounds formed with orthophosphate ions are $Na_2HPO_4$, $NaH_2PO_4$ and $Cu_3(PO_4)_2$. Examples of compounds formed with the sulphate ion are $KHSO_4$ and $(NH_4)_2SO_4$.

The solution is an aqueous solution which can be used over a temperature range from room temperature to 150° F. A temperature of 130°± 5° F. is preferred.

The following Table III compares two selected prior art solutions with the solution described herein:

TABLE III

| Solution | Weight Loss Per Area to remove burrs Copper Foil (g./cm.²) |
|---|---|
| A | |
| 48% Nitric Acid, 7% Nitric Acid Room Temperature | 0.18 |
| B | |
| 75 g./LL. Ammonium persulphate (10% by volume) Sulfuric Acid | 0.33 |
| C | |
| 64g./l. Sodium dichromate-2 waters of hydration 177 cc./l. Sulfuric Acid, 20 cc./l. Phosphoric Acid, 85%), at a temperature of 140° F. | 0.16 |

On the above Table III it can be seen that Solutions A and C rapidly remove burrs without a corresponding large weight loss of the copper foil. Solution B causes a relative large loss of copper foil material during the etching (shaping) process.

However, although solution A has an acceptable deburring rate, the etchant fumes when exposed to the air and continues to etch the copper foil. In the usual case, approximately 15 to 30 seconds may be required to transfer materials from a deburring tank. As a result, solution A continues to etch after being removed from the deburring tank. In addition, solution A yields noxious gases.

The following Table IV compares the effects of air on the parts being deburred. Only Solutions A and C are compared:

TABLE IV

Effect of Air on Parts Being Deburred

| Solution | Immersion time | Rate of Attack of Immersion time given: Immersion only | Immersion plus 15 seconds in air |
|---|---|---|---|
| A | 15 seconds | 0.0038 g./cm.² | 0.0062 g./cm.² |
| C | 40 seconds | 0.0029 g./cm.² | 0.0030 g./cm.² |

As indicated from the above table, the part was immersed in solution C for approximately 40 seconds. Generally, from 10 to 50 seconds are required with 24 seconds being the optimum immersion time. It is also pointed out that after the parts are removed from the deburring tank, solution C resulted in an additional etch of 0.0001 g./cm.² and solution A etched an additional 0.0024 g./cm.². The etch rate of solution A was relatively faster than the etch rate of solution C.

The etch rate of solution C is also controllable by numerous methods. For example, the temperature, time of immersion, agitation rate, and composition of the solution can be changed. Some of the variables of the solution are illustrated in the following Table V.

TABLE V

Rate of Attack of Solution C

| cc./l. $H_3PO_4$ | g./l. $Na_2Cr_2O_7$ $2H_2O$ | Rate of attack g./cc.² for 40-second immersion time: Without Agitation | With Agitation |
|---|---|---|---|
| 20 | 28 | 0.0037 | 0.0051 |
| 20 | 50 | 0.0058 | 0.0081 |
| 20 | 82 | 0.0071 | 0.0112 |
| 20 | 113 | 0.0091 | 0.0128 |
| 0 | 113 | 0.0097 | |
| 10 | 113 | 0.0092 | |
| 20 | 113 | 0.0091 | |
| 30 | 113 | 0.0072 | |
| 40 | 113 | 0.0062 | |

As indicated in Table V, for a sodium dichromate solution with an orthophosphate ion, the rate of attack for a 40 second immersion time was increased from 0.0037 g./cc.² to 0.0051 g./cc.² with agitation. The agitation may be achieved by ultrasonic vibrations; moving the parts rack relative to the solution; or moving the tank relative to the parts rack. If a reciprocating rack is used, an agitation rate of 20 to 30 inches per minute is satisfactory.

In addition to shaping the metal foil layer, the epoxy-glass surface is also conditioned by the solution so that metal plated on the epoxy-glass has an improved quality. In other words, the epoxy layer does not separate as shown by numeral 10 in FIG. 1 of the prior art.

Figure 2:
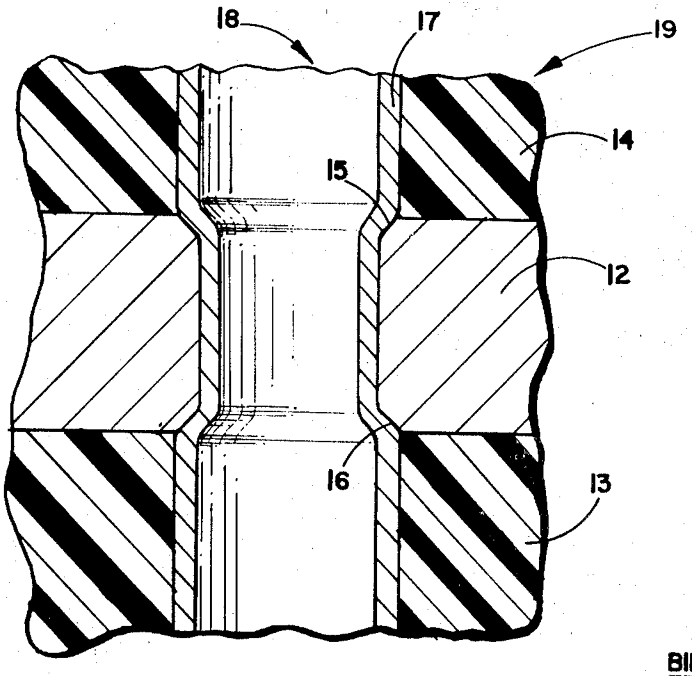
FIG. 2 is a cross-sectional view of one-half of a plated through hole produced by a process using an improved shaping and conditioning solution.

FIG. 2 is a cross-sectional view of a plated through hole 18 of a printed wiring board 19 showing copper foil layer 12 sandwiched between epoxy layers 13 and 14. The relatively sharp edges of the copper foil layer shown by numerals 4 and 5 of FIG. 1 are removed by the deburring solution so that the copper foil layer 12 has relatively rounded edges 15 and 16 on which metal layer 17 is deposited. In the usual case, the metal layer 17 is deposited by known techniques.

As a result of blunting, or rounding, the exposed edges of the copper foil layer 12, a relatively uniform metal layer 17 is deposited without "ghost planes" as shown and described in connection with FIG. 1. In addition, it is pointed out that the copper layer 17 adheres relatively well to the epoxy-glass layers 13 and 14 adjacent to the copper foil layer 12. In other words, the use of the deburring solution conditioned the epoxy-glass surfaces for reducing the separation which often happens as shown and described in connection with FIG. 1.

In one operation sequence, the deburring solution can be used in producing printed wiring boards. For that case, a copper clad epoxy-glass laminate is cut to size and drilled according to a predetermined pattern. The copper foil layers are sanded to remove a major portion of the burrs or protruding edges. After the surfaces have been sanded, the epoxy-glass is etched back or chemically cleaned to remove the epoxy from the metal interconnects. The board is then rinsed.

In one embodiment, the board is placed on a rack and immersed in a deburring solution for the time and at the temperatures indicated above. Following the deburring step, the board is rinsed and cleaned in an alkaline cleaner. It is pointed out that the board could be cleaned in an alkaline cleaner and then immersed in the deburring solution if preferred. The exact sequence of steps is not critical.

After being cleaned in an alkaline cleaner, the board is dipped in acid, sensitized and activated in accordance with known techniques. The board is then rinsed, and an electroless layer of copper is deposited on the board surfaces and in the holes. The board is then rinsed and a copper layer is electrolitically deposited in the holes and on the board's surfaces.

It is pointed out that the above description of one process sequence is not intended to limit the use of the deburring solution to that sequence. It was given to illustrate one practical use of the deburring solution. For example, other dielectric laminates such as phenolic, polyimide, epoxy resins, etc. can be conditioned by the solution.

We claim:

1. A conditioning and shaping aqueous solution for a metal clad dielectric substrate, said solution comprising, a soluble chromium oxide combination yielding an equivalent molar amount of chromium + 6 ion, a source of soluble sulphate ion, and a source of soluble orthophosphate ion, said solution being maintained at a pH of less than 1.

2. The solution recited in claim 1 wherein said ions are provided by alkali metal compounds.

3. The solution recited in claim 1 wherein said chemical ions are selected from chemical compounds from the group consisting of copper compounds, sodium compounds, lithium compounds and ammonium compounds.

4. The solution recited in claim 1 wherein said ions are combined in said solution by a composition selected from the compositions comprising $Cr_2O_7^{-2}$, $SO_4^{-2}$, $PO_4^{-2}$; $CrO_4^{-2}$, $SO_4^{-2}$, $PO_4^{-2}$; and $CrO_3$, $SO_4^{-2}$, and $PO_4^{-2}$.

5. The solution recited in claim 1 wherein the range of said chromium + 6 ion in said solution is 20 to 160 grams per liter; the range of said sulphate ion is between 200 to 400 grams per liter; and the range of said orthophosphate ion is between 17 to 100 grams per liter.

6. The solution recited in claim 5 wherein said chromium + 6 ion is supplied by sodium dichromate, said sulphate ion is supplied by sulfuric acid, and said orthophosphate ion is supplied by orthophosphoric acid and said solution is maintained at a temperature between room temperature and 150° F.

7. The solution recited in claim 6 wherein sodium dichromate in said solution is approximately 64 grams per liter, said sulfuric acid is approximately 313 grams per liter and said orthophosphoric acid is approximately 34 grams per liter, and said solution being maintained at a temperature of between 125° and 135° F.

8. A process for conditioning an epoxy-glass layer for plating and for shaping the edges of a copper foil layer on said epoxy-glass layer for said process comprising the steps of, immersing said epoxy-glass layer clad on at least one surface by said copper foil layer in a solution comprising a soluble chromium oxide combination yielding an equivalent molar amount of chromium + 6 ion, a soluble sulphate ion, and a soluble orthophosphate ion.

* * * * *